United States Patent [19]

Roberge

[11] Patent Number: 5,111,065

[45] Date of Patent: May 5, 1992

[54] DIODE DRIVER CIRCUIT UTILIZING DISCRETE-VALUE DC CURRENT SOURCE

[75] Inventor: James K. Roberge, Lexington, Mass.

[73] Assignee: Massachusetts Institute of Technology, Cambridge, Mass.

[21] Appl. No.: 497,993

[22] Filed: Mar. 23, 1990

[51] Int. Cl.[5] .......................... H03K 3/01; H03K 3/42; H03K 3/26; H01S 3/00
[52] U.S. Cl. .................................. 307/270; 307/311; 307/315; 372/38
[58] Field of Search ...................... 307/311, 270, 315; 372/38; 250/205

[56] References Cited

U.S. PATENT DOCUMENTS

| | | | |
|---|---|---|---|
| 4,145,649 | 3/1979 | Pickton | 323/4 |
| 4,292,606 | 9/1981 | Trimmel | 332/7.51 |
| 4,489,415 | 12/1984 | Jones, Jr. | 372/38 |
| 4,736,380 | 4/1988 | Agoston | 307/311 |
| 4,799,224 | 1/1989 | Bottachi et al. | 307/311 |
| 4,803,384 | 2/1989 | Yamane et al. | 307/490 |
| 4,912,714 | 3/1990 | Hatanaka et al. | 372/38 |

FOREIGN PATENT DOCUMENTS 0092884 6/1982 Japan ...................... 372/38

Primary Examiner—Stanley D. Miller
Assistant Examiner—Trong Phan
Attorney, Agent, or Firm—Hamilton, Brook, Smith & Reynolds

[57] ABSTRACT

A diode driver circuit has an adjustable, fixed-value current source and a variable offset current source for drawing a bias current through a laser diode. A Darlington pair buffer circuit isolates the diode from the rest of the driver circuit. The output current of the offset current source is controlled by a number of digital-to-analog converters each controlling a different contribution to the total offset current. A diode protector circuit protects the diode when the system is in an inactive state.

27 Claims, 6 Drawing Sheets

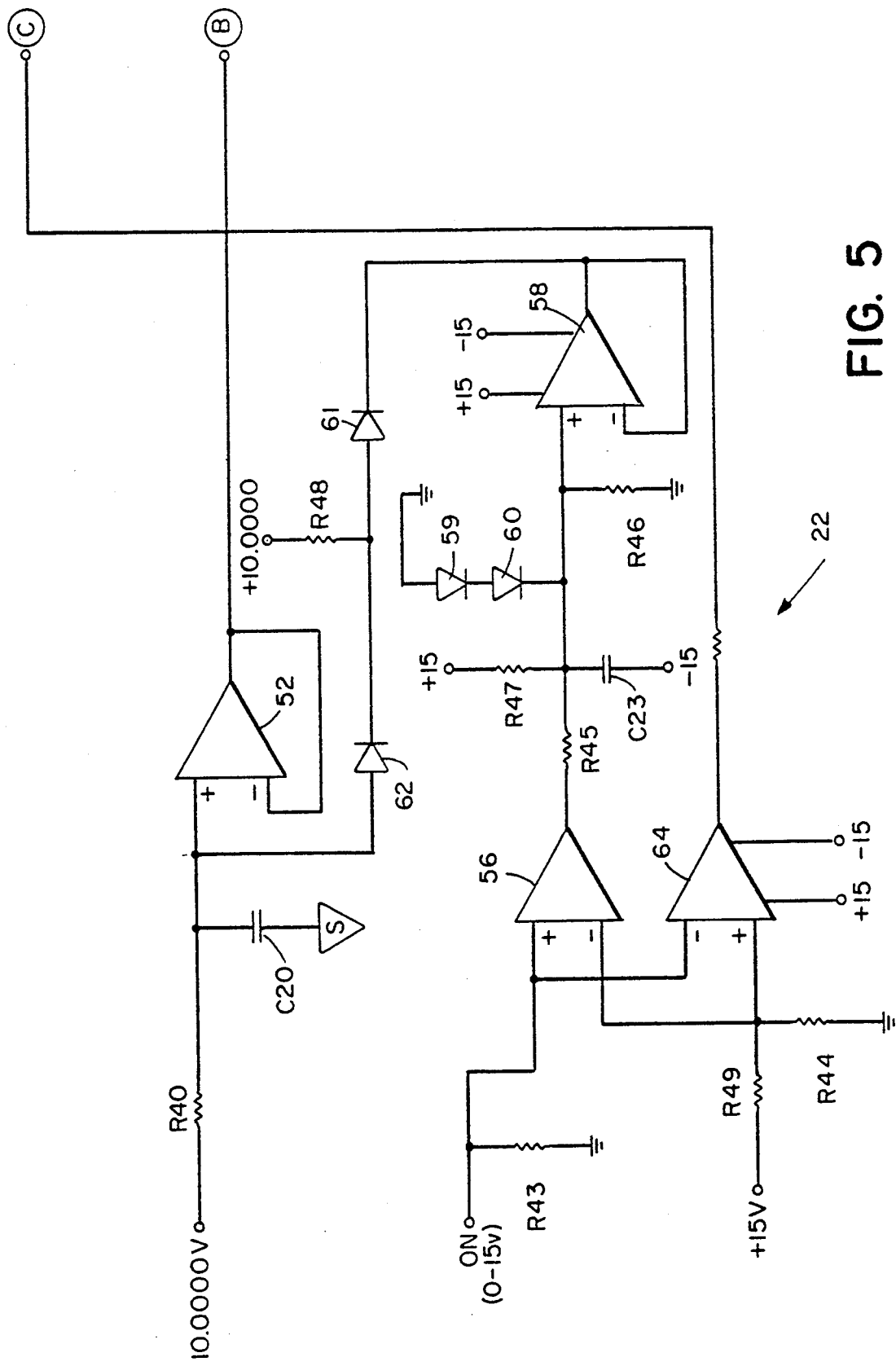

DIODE DRIVER CIRCUIT UTILIZING DISCRETE-VALUE DC CURRENT SOURCE

GOVERNMENT SUPPORT

This invention was made with Government support under Contract No. F19628-85-C-0002 awarded by the Department of the Air Force. The Government has certain rights in the invention.

BACKGROUND OF THE INVENTION

As the use of laser diodes to generate modulated optical signals becomes more widespread, the need for a stable bias current source to set the diode operating point is becoming more strongly felt. The need for more complex communications over longer and longer distances, such as cross-links between satellites, has driven the desirable modulation frequency of laser diodes well up into the GHz range. To support these applications, diode control circuits are required which have high output impedances and very low capacitive shunting such that high modulation frequencies may be efficiently used. In addition, improved temperature stability and bias current stability must be implemented in order to keep the optical frequency of the diode output stabilized.

SUMMARY OF THE INVENTION

In accordance with the present invention, a driver circuit for a laser diode has a fixed-value DC current source for drawing a current through the diode. A variable DC offset current source is placed in parallel with the fixed-value source to allow adjustment to the diode bias current. To electronically isolate the diode from the current sources, a common-base Darlington transistor pair buffer circuit is placed in series between the diode and the current sources. The buffer circuit is placed physically adjacent the diode such that any substantial length of coupling between the diode and the current sources is to the side of the buffer away from the diode. The Darlington buffer provides a high output impedance and low output capacitance with excellent temperature stability of current gain.

To prevent the current in the diode from changing too rapidly, control is provided which causes the current drawn by the current sources to increase gradually from zero to a normal operating level. Once at an operating level, the diode current is adjusted by adjusting the offset current source. A plurality of digital-to-analog converters control, to different resolutions, contributions to the total offset current thereby allowing the total diode current to be precisely controlled. Once the operating current is established, a modulation signal is input between the diode and the buffer circuit to provide the necessary modulation of the diode current.

BRIEF DESCRIPTION OF THE DRAWINGS

FIG. 5 shows in detail the soft start circuit shown in the block diagram of FIG. 1.

DETAILED DESCRIPTION OF A PREFERRED EMBODIMENT

Figure 1:
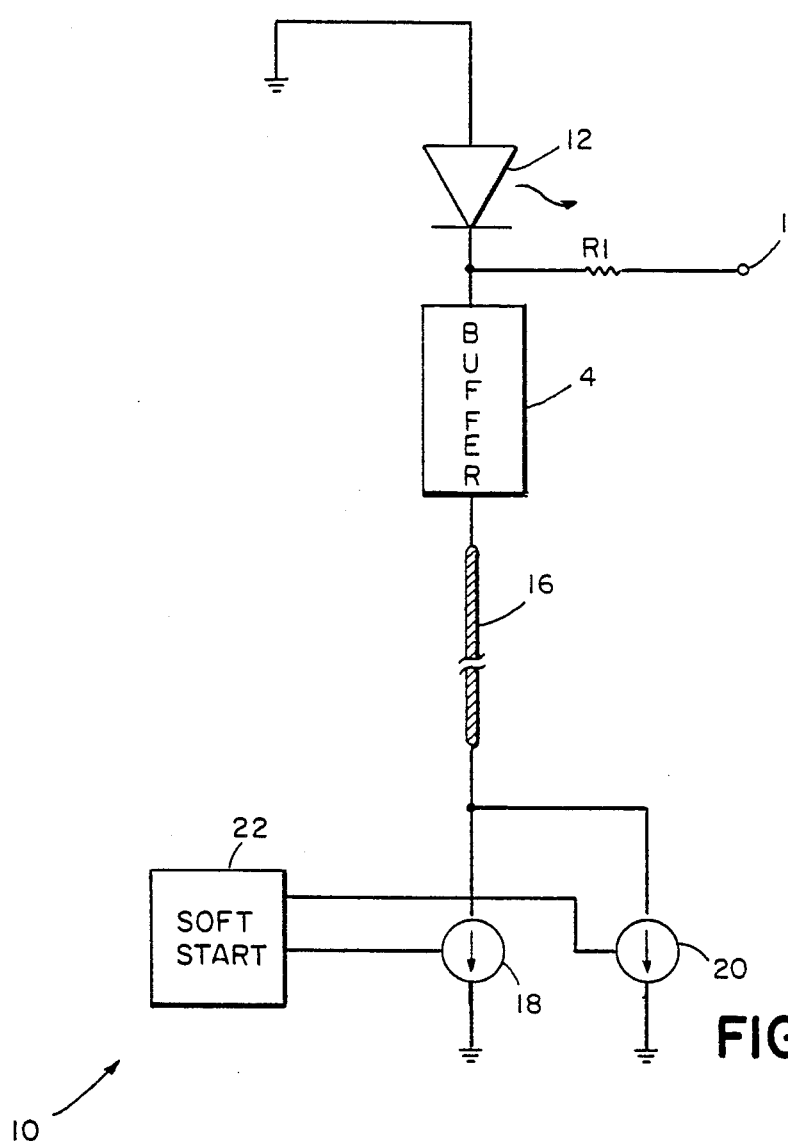
FIG. 1 is a block diagram overview of a diode driver circuit.

FIG. 1 is a system overview of a diode driver circuit 10 having a laser diode 12 which emits coherent light when a current is drawn through the diode 12. The diode 12 is an optical source in a high frequency modulated optical communication system. The diode has a clean optical output and a relatively fast switching speed. The high switching speed is necessary since the diode is modulated at frequencies well into the GHz range.

One side of diode 12 must be tied to a fixed potential and the other to a current source. Which side of the diode is tied to the current source depends on whether the source will "push" or "pull" current through the diode. In the present embodiment the anode of the diode 12 is tied to ground while the cathode is connected through a buffer amplifier 14 and cable 16 to current sources 18 and 20. The high frequency modulating signal is applied to the diode 12 from modulation input 16 through input resistor R1. The modulation signal is used to supply frequency modulation to the diode 12.

The output capacitance of a current source tends to be high. In the preferred embodiment, a shielded cable 16 is used to connect the diode 12 and the driving current sources 18, 20. The cable 16 is a high capacitance conductor, but other types of connectors can be used in alternative embodiments.

The high capacitance of the current sources and cable would ordinarily result in significant high frequency losses with high frequency modulation of the diode. The buffer 14, however, has a high output impedance to isolate the diode from the current source and shielded cable. The buffer 14 also has a low output capacitance to allow for the high frequency modulation. By locating the buffer 14 adjacent to the diode 12, the circuit paths between the diode 12 and the buffer 14 are as short as possible and the introduction of additional capacitance is minimized.

Current source 18 is a fixed-value current source which is very stable, the current drawn by the source 18 changing very little with time and temperature changes. The fixed-value current source 18 is set to draw the preferred driving current of the diode 12, and will draw that current throughout operation of the circuit with very little fluctuation. In a preferred embodiment, the current source 18 is adjustable to allow the fixed-value current to be switched between a number of discretely different stable values.

The offset current source 20 is a variable current source which is connected in parallel with the fixed-value current source 18. The variable current source 20 is necessary because, although the fixed-value current source 18 does not fluctuate much, the operating characteristics of the laser diode 12 and other circuit components may change with time and temperature. Often as the temperature of a laser diode increases, the output wavelength of the diode relative to the current drawn through the diode will change. For this reason it is desirable to correspondingly change the current drawn through the diode in order to keep the diode output stable in wavelength. The offset current source 20 is thereby capable of generating either a positive or negative current to compensate the current drawn by the fixed-value current source 18.

Also included in the driver circuit 10 is a soft start circuit 22 which prevents the current sources from reaching a maximum value too quickly when the circuit is first turned on. The soft start circuit controls the current increase drawn by the current sources 18, 20 such that the current drawn by the sources 18, 20 ramps up gradually from zero to a maximum value. This gradual start up is to protect the laser diode 12 from experiencing a rapid change in operating current. Very often laser diodes such as diode 12 are sensitive to fast current changes and may be destroyed if the current drawn through them is increased too rapidly.

Figure 2:
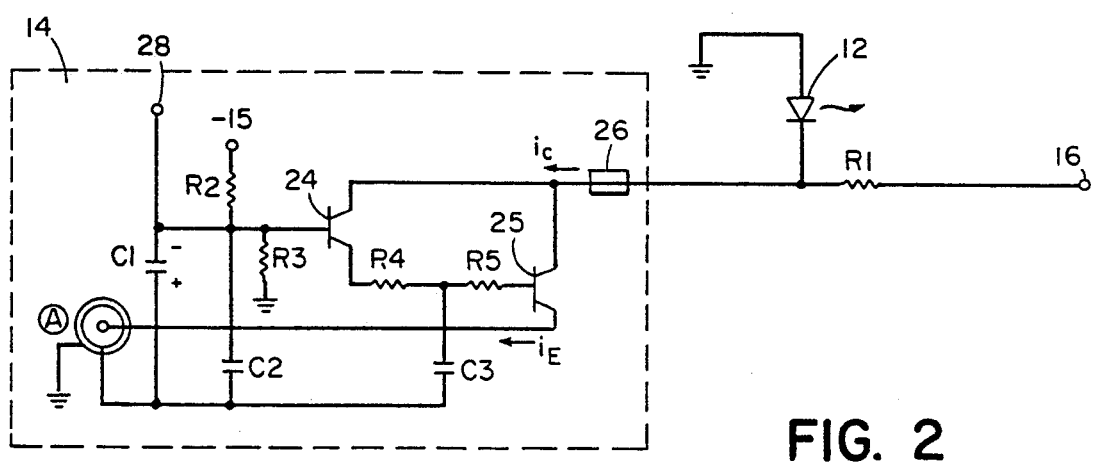
FIG. 2 shows in detail the diode and buffer portions of the block diagram of FIG. 1.

FIG. 2 shows in detail the laser diode 12, the modulation input 16 and the buffer amplifier 14. The primary element of the buffer 14 is the Darlington transistor pair formed by transistors 24, 25. The Darlington pair presents a very high output impedance which isolates the modulation portion of the circuit from the current sources and shielded cable 16 to minimize high frequency losses. An isolator 26 is positioned between the Darlington pair 24, 25 and the modulation portion of the circuit to further isolate the diode from high frequency losses. In the present embodiment the isolator 26 is a ferrite bead.

The current stability provided by the Darlington pair buffer amplifier 14 is demonstrated by the gain formulae of transistors 24 and 25. The emitter-to-collector gain of a single transistor may be approximated by:

$$i_C/i_E = \beta/(1+\beta) \neq 1 - 1/\beta$$

For current stability, $i_C/i_E$ must fluctuate as little as possible with temperature changes. Since $\beta$ is typically temperature dependent, it is therefore desirable to make the $1/\beta$ component of the above equation as small as possible. If the gain, $\beta$, of each of transistors 24, 25 is equal, then the gain of the Darlington transistor pair may be approximated by:

$$i_C/i_E \neq 1 - 1/\beta^2$$

With $\beta$ being squared in the above equation, the overall contribution of the temperature-dependent element of the gain equation is significantly less than the single transistor case. This correspondingly improves the overall stability of the diode driver circuit 10. The temperature stability may be further increased, if necessary, by adding to the number of transistors of the Darlington combination. Each additional transistor increases the power of $\beta$ in the $i_C/i_E$ approximation. and therefore further reduces the contribution of the temperature-dependent element.

Current from current sources 18, 20 is drawn through the buffer amplifier 14 from coaxial terminal A indicated in FIG. 2. The current source can be adapted to supply one of a number of different diodes, each having its own buffer circuit. To select one of the diodes, a control voltage is applied at bias input 28 of the buffer circuit corresponding to the desired diode.

Figure 2A:
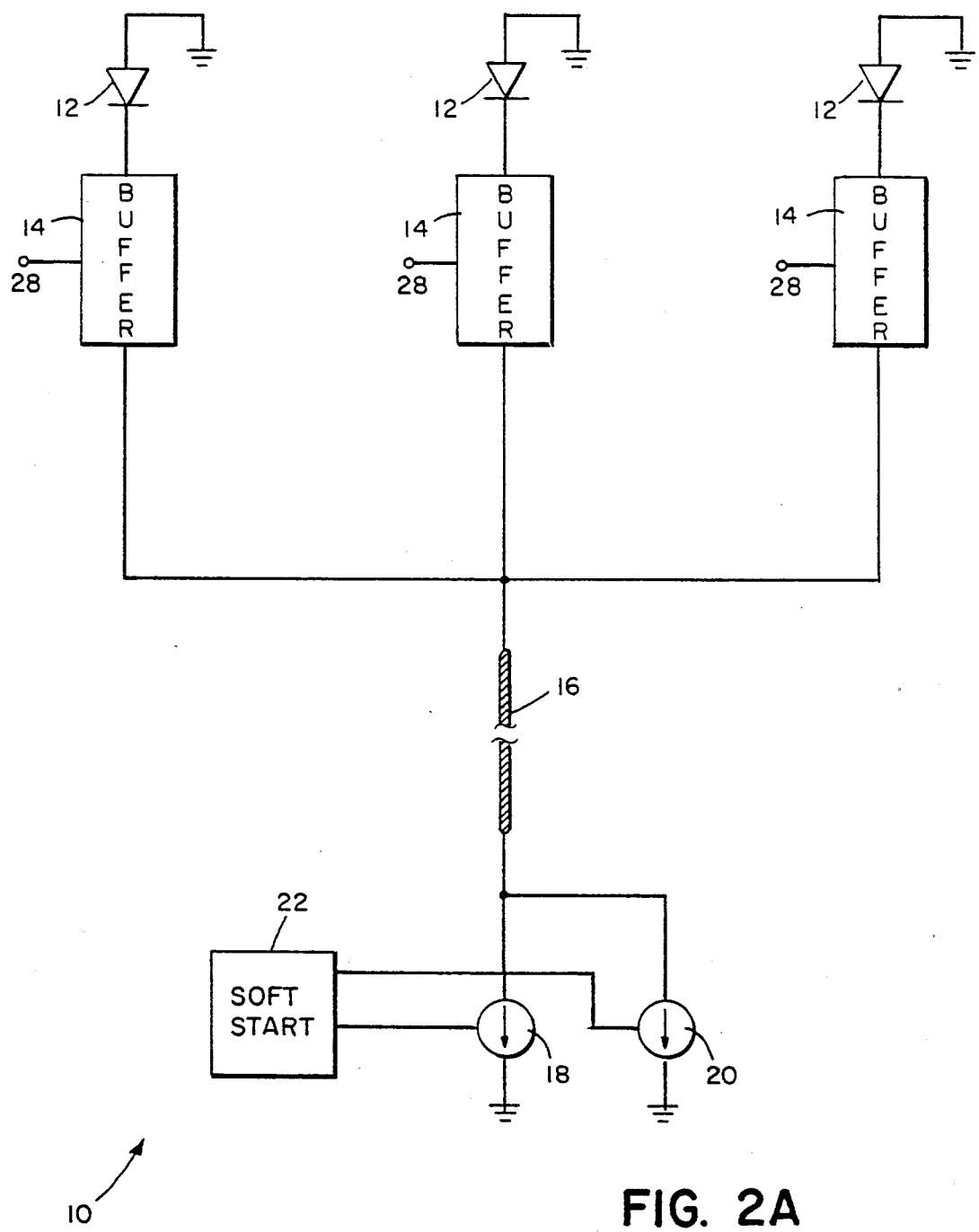
FIG. 2A is a schematic illustration of a system having three laser diodes and associated buffers with provision for selecting the active diode.

Each bias input 28 allows a different diode to be electronically selected through the application of a control voltage at the selected bias input. Resistors R2 and R3 are biasing resistors which set up a negative voltage on the base of transistor 24. This voltage must be overcome by the control voltage input at 28 to switch on the buffer amplifier. FIG. 2A illustrates an arrangement in which current sources 18, 20 are used to drive one of a number of different diodes 12 with their accompanying buffer circuits 14. Each has a bias input 28 which allows the desired diode circuit to be selected When one diode is selected, the others are not accessible by the current source. The selectability feature of the diode circuit allows one to choose a desired diode from a number of possible different choices. Resistors R4 and R5 are included to improve the filtering described below and to eliminate the possibility of high-frequency oscillation of transistor 25. Capacitors C1, C2, and C3 are tied to a signal ground through terminal A and act as low pass filters to prevent high frequency transients from modulating the bias current.

Figure 3:
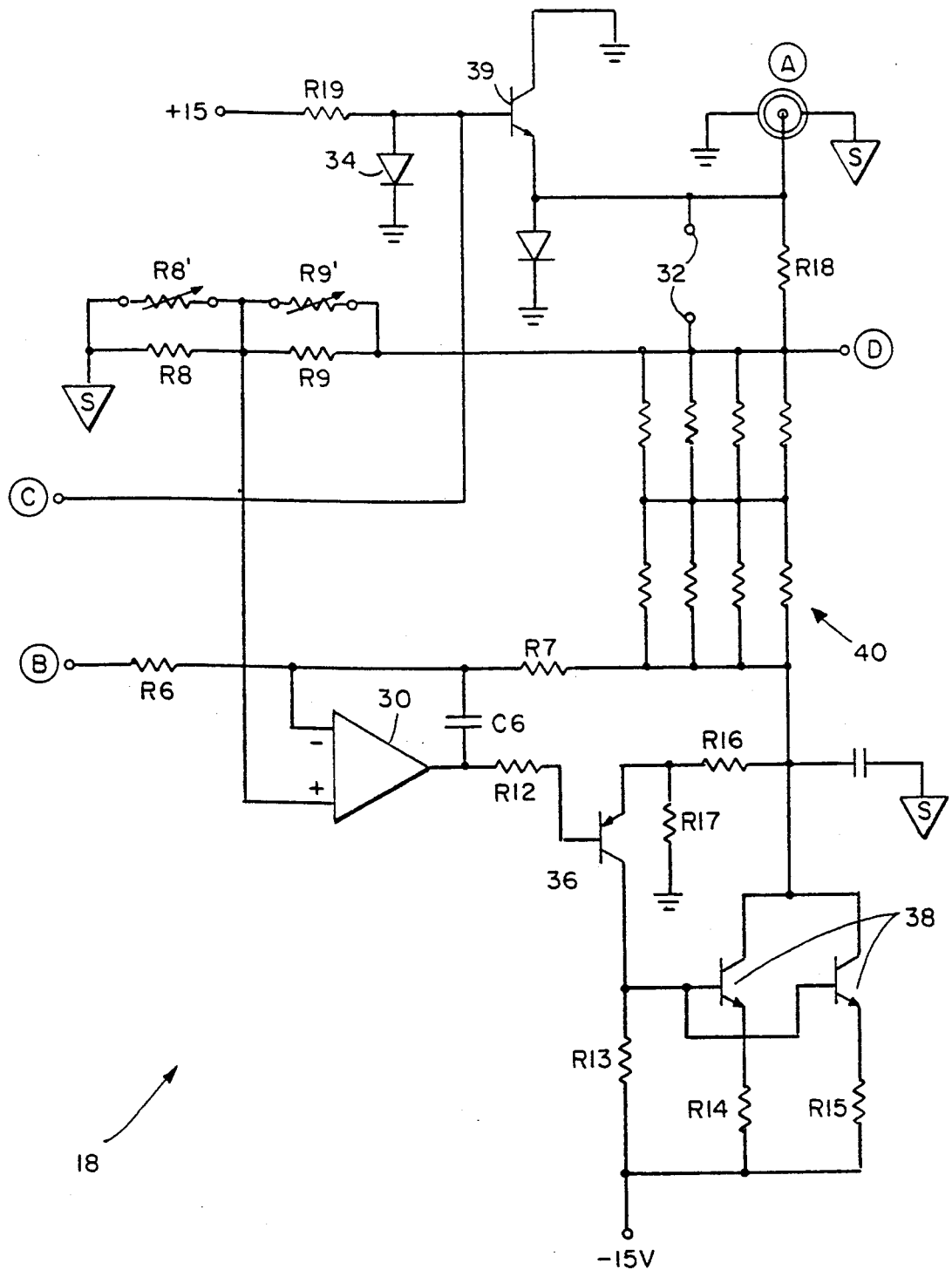
FIG. 3 shows in detail the stable fixed-value current source of the block diagram of FIG. 1.

Terminal A of FIG. 2 is in electrical connection with terminal A of FIG. 3 through the shielded triaxial cable 16. The inner shielding layer of the cable 16 carries signal ground and the outer shielding carries system ground. The outer layer is provided to help shield the cable from external field effects.

FIG. 3 shows in detail the fixed-value current source 18 which drives the laser diode 12. Terminal B indicated in FIG. 3 is a clean ten-volt voltage input controlled by the soft start circuit 22. This voltage is input to the negative input terminal of operational amplifier 30. The op-amp 30 is configured with resistors R6, R7, R8, R9 along with resistor array 40 in a configuration based on a Howland current source. The Howland current source uses a feedback technique which makes the output a true current source controlled from terminal B. In this particular embodiment, the output resistance of the circuit shown in FIG. 3 is actually made negative, to cancel the loading of other circuits that are connected to terminal D. Because of the tolerances of resistors R6, R7, R8 and R9, variable resistances R8' and R9' are included in the Howland configuration to allow trimming of the circuit to achieve the desired current output in spite of the resistor tolerances. Capacitor C6 is a small capacitance to improve amplifier stability. The output of op-amp 30 drives an amplifier consisting of resistors R12, R13, R14, R15, R16 and R17, and transistors 36 and 38. This amplifier effectively provides op-amp 30 with an output stage that can supply the current required from the current source.

Before reaching transistors 38, current drawn from terminal A passes through precision resistor R18 and resistor array 40. Precision resistor R18 allows determination of the current drawn by the current source by measuring the voltage across terminals 32. This gives a measure of the voltage across resistor R18 which has a tight enough tolerance to allow accurate determination of the current passing through it using Ohm's law.

The resistor array 40 is an arrangement used to reduce noise and improve resistor stability which may also be used in other parts of the driver circuit 10. A plurality of resistors are used to form a single resistance. The purpose of this is to reduce the power dissipated in each resistor, therefore reducing the thermal noise generated by the total resistance, and improving the stability of the resistor.

Figure 3A:
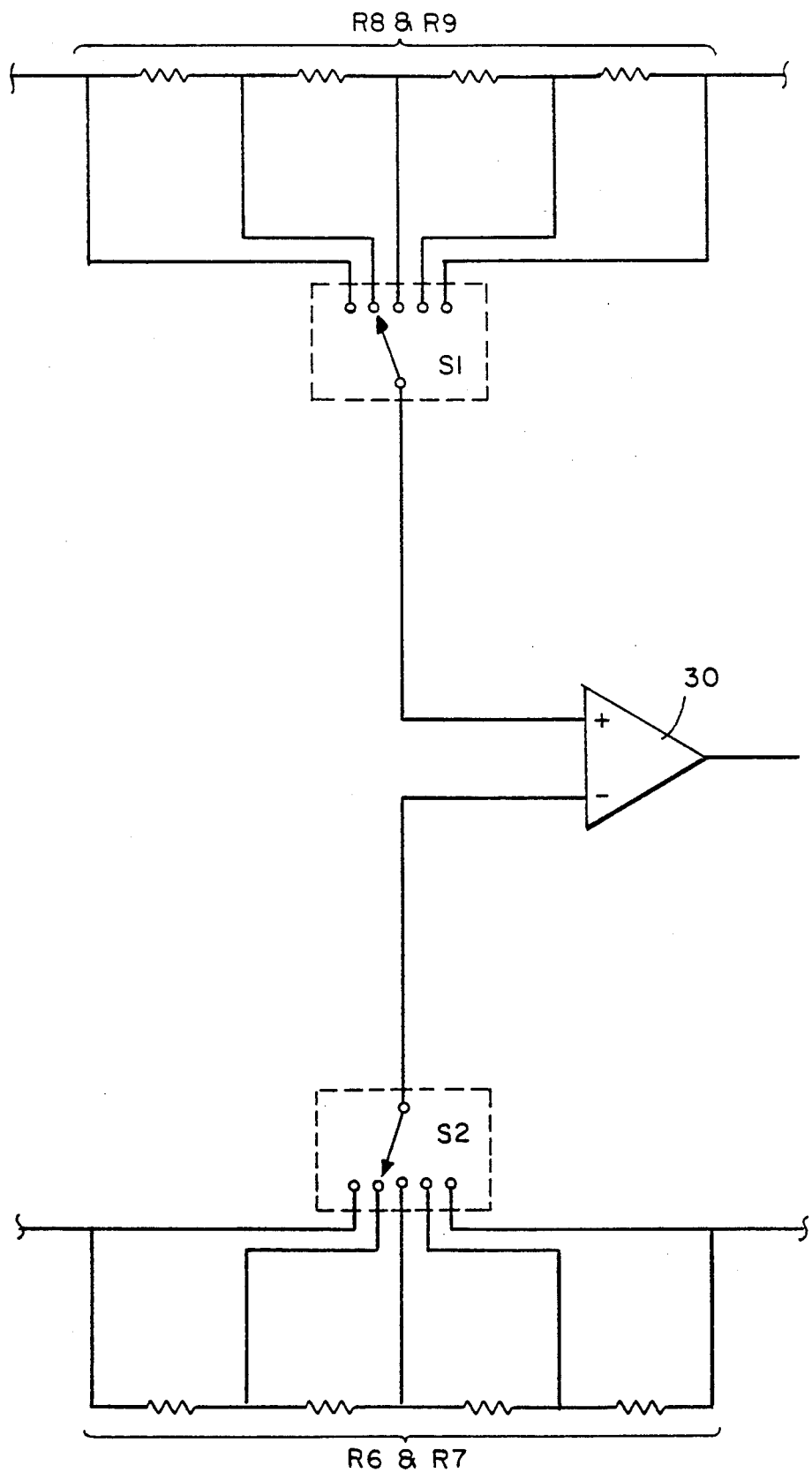
FIG. 3A shows the stepped current feature of a preferred embodiment of the invention.

The value of the current provided by the current source can be adjusted by adjusting the values of some or all of the resistors R6, R7, R8, R9, and R40. The illustration of FIG. 3A shows a preferred method of implementing the current source adjustability. Resistors R8 and R9 are replaced with a series of precision resistors. The non-inverting input of op-amp 30 is connected to one of a number of different points along the resistors chain via single-pole multi throw switch S1. Similarly, the inverting input of op-amp 30 is connected to a resistor chain replacing resistors R6 and R7 via single-pole multi-throw switch S2. The switches S1 and S2 are selected to be clean, non-loading switches. By selecting different positions for each of the switches S1 and S2, the relative resistor arrangements seen by op amp 30 is changed and a different fixed-value current is drawn by current source 18.

The adjustability of the fixed-value current source 18 is an advantageous feature because it allows the range of the variable current source 20 to be significantly reduced. Because the variable current source 20 is less stable than the fixed-value current source 18, it is desirable to make the current contribution of the variable current source 20 as small as possible. By allowing the discrete current drawn by the fixed-value current source 18 to be changed, the range that must be covered by the variable current source 20 is consequently reduced.

Referring to FIG. 3, a laser diode protection circuit is provided by transistor 39 and associated components. When the system is in the off state, terminal C, shown in FIG. 3, is open circuited. The voltage on the base of transistor 39 is therefore controlled by the 15-volt power supply which feeds diode 34 through resistor R19. Diode 34 dominates the voltage on the base of transistor 39 making it equal to the diode 34 voltage drop. Thus, when the driver circuit is off, transistor 39 is active and any currents erroneously drawn by the current source 18 are grounded through the collector of transistor 39. This prevents any unwanted currents being drawn through terminal A and consequently through the laser diode 12 when the circuit is off. When the circuit is turned on, the voltage on terminal C becomes a negative voltage. Current flow through transistor 39 is thus cut off, and normal driver circuit operation resumes.

Figure 4:
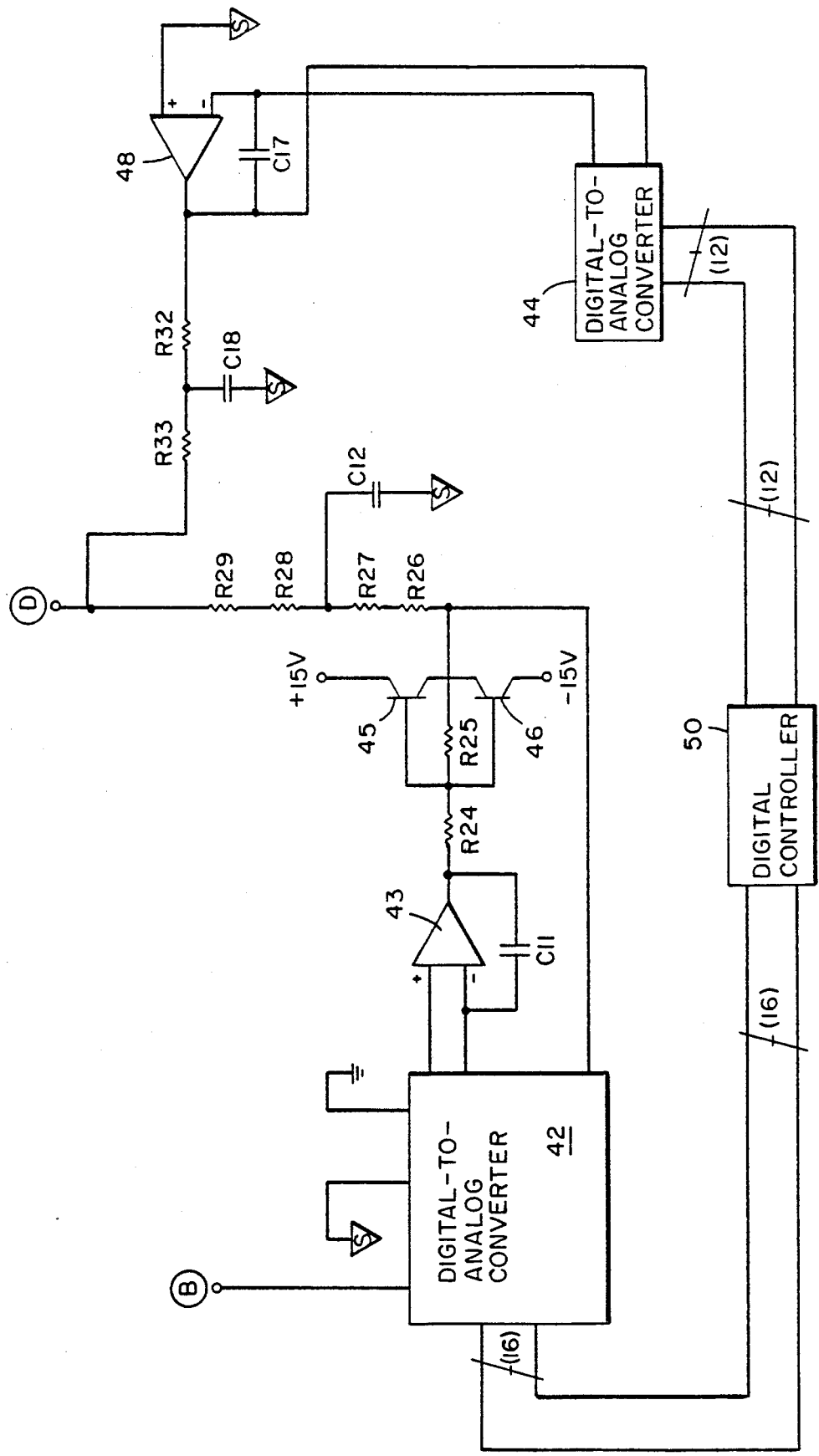
FIG. 4 shows in detail the variable offset current source of the block diagram of FIG. 1.

A preferred embodiment of the offset current source is shown in detail in FIG. 4. The offset current source 20 is made up of two separate current generators. For accuracy and versatility, the amount of the current drawn by offset current source 18 is determined by current mode digital-to-analog converters (DACs) 42, 44. DAC 42 is a 16-bit device which, combined with operational amplifier 43, resistors R24 and R25, and transistors 45 and 46 in the present embodiment, provides a $\pm 10$-volt range at the emitters of transistors 45, 46. This voltage produces $\pm 30$ mA through resistors R26, R27, R28 and R29. Other values of current swing may be chosen by appropriately selecting the value of resistors R26, R27, R28 and R29, while adjusting the Howland-type circuit to maintain current source operation. In general, lower values of offset currents generally lead to more stable operation.

Terminal B of FIG. 4 is electrically connected to terminal B of FIG. 3 and thus also receives the switched 10-volt reference from the soft start circuit 22. The 10-volt reference is input to 16-bit DAC 42.

A second current output DAC 44 is a 12-bit DAC and is used to provide added resolution to the variable current source 20. Functioning in the same manner as DAC 42, DAC 44 combines with op-amp 48 to provide an output current. The output current swing of DAC 44 is $\pm 0.5$ mA, providing the desired degree of resolution.

Currents from both DACs of the offset current source 20 are applied to terminal D.

Generating the digital inputs to DACs 42, 44 is digital controller 50. The digital controller 50 is a digital number generator which may be part of a more elaborate computer control system for controlling the driver circuit 10. Through digital controller 50, the amount of offset current drawn by offset current source 18 is easily controlled through control of DACs 42, 44. The digital controller may also be part of a feedback system to detect variations in the optical wavelength of laser diode 12 and apply control signals to offset current source 18 in order to compensate the overall current being drawn through diode 12.

Shown in FIG. 5 is a preferred embodiment of soft start circuit 22. A clean 10-volt reference voltage is fed through a resistance R40 into the positive input terminal of op-amp 52. Capacitor C20, also on the positive input terminal of op-amp 52, acts in a low pass filtering capacity to remove any high frequency signals from the positive input terminal. Op-amp 52 is in a voltage follower configuration and acts as a buffer to source the clean 10-volt output to terminal B.

Input terminal "ON" leads to the positive input terminal of comparator 56. A voltage from the "ON" input is developed across resistance R43. The voltage at input terminal "ON" is switched from 0 volts to 15 volts to turn the driver circuit on. When the "ON" voltage is 0 volts, the output of comparator 56 is at 15 volts, since the negative input terminal of comparator 56 is held positive through resistors R44 and R49. The output terminal of comparator 56 is coupled through a resistance R45 to the positive input terminal of op-amp 58. When the output of comparator 56 is negative, the input voltage on the positive input terminal of op-amp 58 is dominated by the voltage drops of diodes 59, 60. Since these two diodes are connected in series to ground, the voltage on the positive input terminal of op-amp 58 is equal to the sum of the voltage drops across diodes 59, 60, or approximately $-1.4$ V. Since op-amp 58 is in a voltage follower configuration, the output of op-amp 58 is also approximately $-1.4$ V. Diodes 61 and 62 have the same voltage drops as diodes 59, 60, and therefore the voltage on the positive input terminal of op-amp 52 is approximately 0 volts.

When the "ON" input is switched to its high state of 15 volts, the output of comparator 56 becomes an open circuit. This change causes capacitor C23, tied to the output of comparator 56, to charge gradually to a value approaching 15 volts. Charging voltage is provided from the $+15$ V supply terminal through resistance R47. This ramp-up in voltage correspondingly appears at the output of op-amp 58. The result is a gradual voltage increase on the positive input terminal of op-amp 52 from 0 to its 10-volt maximum. This voltage increase correspondingly appears on the output terminal of op-amp 52, and thereby at terminal B. Since the voltage on terminal B controls the operation of fixed-value current source 12 and offset current source 18, viewing FIGS. 3, 4 and 5 simultaneously makes it apparent that these current sources ramp up from 0 amps to their maximum operating currents as the voltage on terminal B ramps from 0 to 10 volts. Thus, the current sources are correspondingly prevented from increasing the current drawn through the laser diode 12 too quickly.

Again referring to FIG. 5, comparator 64 is shown having a 15-volt input at its positive input terminal through resistance R49 while its negative input terminal is tied to the "ON" input. The output of comparator 64 leads to the base of transistor 38 of FIG. 3, which is the transistor controlling the diode protector circuit. When the "ON" input is in its low state at 0 volts, the output of comparator 64 is an open circuit. The voltage seen by the base of transistor 38 is the voltage drop across diode 40 provided by resistor R19. Thus, when the "ON" input is low, the transistor 38 is held in its active state and grounds any current drawn by the current sources However, when the "ON" input switches to its high state of 15 volts, the output of comparator 64 switches to −15 volts and consequently pulls the base of transistor 38 to a negative potential. This cuts off current flow through the transistor 38. Thus, no current is drawn through the transistor 38 when the current sources are in their active state, and all the current is correspondingly drawn through the laser diode 12 via terminal A.

While the invention has been particularly shown and described with reference to a preferred embodiment thereof, it will be understood by those skilled in the art that various changes in form and details may be made therein without departing from the spirit and scope of the invention as defined by the appended claims.

I claim:

1. A driver circuit for a laser diode comprising:
   a discrete-value DC current source for drawing a controlled current through the diode;
   Darlington transistor pair buffer circuit electrically in series between the diode and the current source, the buffer circuit being physically located such that any substantial length of coupling between the diode and the current source is to the side of the buffer circuit away from the diode.

2. The driver circuit of claim 1 wherein the DC current source is a discrete-value current source and the driver circuit further comprises a variable DC offset current source electrically in parallel with the discrete-value current source.

3. The driver circuit of claim 2 wherein the driver circuit increases the current drawn through the diode gradually from zero to a maximum operating value.

4. The driver circuit of claim 2 further comprising a digital-to-analog converter for controlling the current level of the offset current source.

5. The driver circuit of claim 4 wherein the offset current source comprises a plurality of digital-to-analog converters each controlling a different percentage of a total offset current drawn by the offset current source.

6. The driver circuit of claim 1 wherein the DC current source comprises a Howland current source.

7. The driver circuit of claim 1 wherein the DC current source is realized by a circuit comprising resistive loads, and wherein one of said resistive loads is a resistance network.

8. The driver circuit of claim 1 wherein the DC current source is referenced to a stable, low noise voltage reference.

9. The driver circuit of claim 8 wherein the voltage reference comprises a diode and an operational amplifier.

10. The driver circuit of claim 1 further comprising a diode protector circuit which provides a substantial short circuit in parallel with the laser diode in response to an input signal indicating that the laser diode is not in use.

11. The driver circuit of claim 1 further comprising a bias input to the Darlington transistor pair by which a signal may be applied to inhibit the flow of current through the Darlington transistor pair.

12. The driver circuit of claim 1 wherein the DC current source is adjustable to any of a plurality of discrete current levels.

13. A driver circuit for a light-emitting laser diode comprising:
    an adjustable, discrete-value, DC current source having a plurality of discrete current levels for drawing a controlled current through the diode;
    Darlington transistor pair buffer circuit electrically in series between the discrete-value current source and the diode and physically located such that any substantial length of coupling between the diode and the discrete-value current source is to the side of the buffer away from the diode; and
    a variable, low-noise, DC offset current source electrically in parallel with the discrete-value current source.

14. The driver circuit of claim 13 further comprising a digital-to-analog converter controlling the current level of the offset current source.

15. The driver circuit of claim 14 wherein the offset current source comprises a plurality of digital-to-analog converters each controlling a different percentage of a total offset current drawn by the offset current source.

16. The driver circuit of claim 13 wherein the current drawn by the discrete-value current and the offset current source increases gradually from an initial value to a normal operating value.

17. A driver circuit for a laser diode comprising:
    an adjustable, discrete-value low noise current source having a plurality of discrete DC current levels for drawing a controlled bias current through the diode;
    a variable DC offset current source electrically in parallel with the discrete-value current source, a current level generated by the offset current source being governed by a plurality of digital-to-analog converters each controlling a different percentage of a total offset current drawn by the offset current source;
    Darlington transistor pair buffer circuit electrically in series between the diode and a parallel combination of the discrete-value current source and the offset current source, the buffer circuit being physically located such that any substantial length of coupling between the diode and a current source is to the side of the buffer circuit away from the diode;
    a modulation input line electrically located between the diode and the buffer circuit for introducing a modulation signal to the diode; and
    a diode protector circuit which provides a substantial short circuit in parallel with the laser diode in response to a signal indicating that the laser diode is not in use.

18. A low-noise, variable DC laser diode driver circuit comprising:
    a controlled, fixed-value DC current source;
    a low-noise, variable DC offset current source electrically in parallel with the fixed-value current source; and
    Darlington transistor pair buffer circuit electrically in series between the current sources and a load driven by the current sources, the buffer circuit being physically located such that any substantial length of coupling between the load and the current sources is to the side of the buffer circuit away from the load.

19. A method of driving a light-emitting laser diode, the method comprising:
   connecting a first terminal of the diode to a fixed potential;
   providing a Darlington transistor pair buffer circuit electrically in series with and contacting a second terminal of the diode;
   providing a discrete-value DC current source in electrical connection with the buffer circuit such that a controlled current due to the discrete-value current source is drawn through the diode and the buffer circuit, the discrete-value current source being implemented such that any substantial length of coupling between the diode and the discrete-value current source is to the side of the buffer circuit away from the diode; and
   modulating current through the diode by inputting a modulation signal at an electrical point between the diode and the buffer circuit.

20. The method of claim 19 further comprising providing a variable DC offset current source electrically in parallel with the fixed-value current source.

21. The method of claim 20 further comprising varying current drawn by the offset current source to keep the light emitted from the diode stable in wavelength.

22. The method of claim 20 further comprising governing current increase through the diode when power is first supplied to a system using the diode, such that current drawn through the diode by the discrete-value current source and the offset current source increases gradually from zero to a normal operating value.

23. The method of claim 20 wherein providing a variable DC offset current source comprises providing a variable DC offset current source the output current level of which is controlled by a digital-to-analog converter.

24. The method of claim 20 wherein providing a variable DC offset current source comprises providing a plurality of digital-to-analog converters each controlling a different percentage of a total DC offset current drawn by the offset current source.

25. The method of claim 20 further comprising providing a stable, low noise voltage reference to which the fixed-value current source is referenced.

26. The method of claim 20 further comprising controlling a signal input to the buffer circuit which inhibits current flow through the buffer circuit.

27. A method of driving a laser diode, the method comprising:
   connecting a first terminal of the diode to a fixed potential;
   providing a Darlington transistor pair buffer circuit electrically in series with said diode and connected to a second terminal of the diode with a coupling distance between the buffer circuit and the diode being minimized, current flow through the buffer circuit being controllable with a signal input to a bias input of the buffer circuit;
   providing a discrete-value DC current source in electrical connection with the buffer circuit to the side of the buffer circuit away from the diode such that a controlled current is drawn through the diode and the buffer circuit;
   providing a variable DC offset current source electrically in parallel with the discrete-value current source, the offset current source having a plurality of digital-to-analog converters each controlling a different percentage of a total DC offset current drawn by the offset current source;
   governing the current increase through the diode when power is first applied to a system using the diode such that the current drawn through the diode by the discrete-value current source and the offset current source increases gradually from zero to normal operating value; and
   varying the current drawn by the offset current source to keep the light emitted from the diode stable in wavelength.

* * * * *

UNITED STATES PATENT AND TRADEMARK OFFICE
CERTIFICATE OF CORRECTION

PATENT NO.  : 5,111,065
DATED       : May 5, 1992
INVENTOR(S) : James K. Roberge It is certified that error appears in the above-identified patent and that said Letters Patent is hereby corrected as shown below:

Claim 1, Column 7, Line 28, insert "a" before "Darlington."

Claim 13, Column 8, Line 11, insert "a" before "Darlington."

Claim 17, Column 8, Line 43, insert "a" before "Darlington."

Claim 18, Column 8, Line 59, insert "a low noise" before "controlled fixed-value" and at Line 63, insert "a" before "Darlington."

Claim 27, Column 10, Line 36, insert "a" before "normal operating value."

Signed and Sealed this

Seventh Day of September, 1993

Attest:

BRUCE LEHMAN

Attesting Officer

Commissioner of Patents and Trademarks